United States Patent [19]
Eng

[11] Patent Number: 6,072,812
[45] Date of Patent: Jun. 6, 2000

[54] DISTRIBUTED FEEDBACK LASER WITH LOSS COUPLING

[75] Inventor: Lars E. Eng, Upper Macungie, Pa.

[73] Assignee: Lucent Technologies Inc., Murray Hill, N.J.

[21] Appl. No.: 08/904,854

[22] Filed: Aug. 1, 1997

[51] Int. Cl.[7] .................................................. H01S 3/085
[52] U.S. Cl. .............................. 372/20; 372/45; 372/96; 372/102
[58] Field of Search ................................ 372/96, 102, 45, 372/50, 20

[56] References Cited

U.S. PATENT DOCUMENTS

| | | | |
|---|---|---|---|
| 5,020,072 | 5/1991 | Abe et al. | 372/102 |
| 5,325,379 | 6/1994 | Amann | 372/20 |
| 5,506,859 | 4/1996 | Ackerman et al. | 372/96 |
| 5,602,866 | 2/1997 | Fukunaga | 372/102 |
| 5,727,015 | 3/1998 | Takahashi et al. | 372/102 |
| 5,821,570 | 10/1998 | Kazmierski et al. | 372/96 |

FOREIGN PATENT DOCUMENTS

| | | | |
|---|---|---|---|
| 0 614 254 A1 | 2/1994 | European Pat. Off. | H01S 3/085 |
| 0 664 588 A1 | 1/1995 | European Pat. Off. | H01S 3/085 |
| 63-241978 | 10/1988 | Japan | H01S 3/18 |
| 91-016288 | 1/1991 | Japan | 372/102 |
| 5-145169 | 6/1993 | Japan | H01S 3/18 |

OTHER PUBLICATIONS

"Complex–Coupled Distributed Feedback Laser With Negative Differential Coupling", B. Kruschwitz and T. G. Brown, Applied Phys. Lett. 67, Jul. 24, 1995, pp. 461–463.

*Primary Examiner*—James W. Davie
*Attorney, Agent, or Firm*—Lester H. Birnbaum

[57] ABSTRACT

The invention is a semiconductor laser including a grating which is formed by regions of high impurity concentration surrounded by material having a lesser impurity concentration. The use of variations in doping concentration rather than different materials to provide reflection in the grating should simplify device fabrication.

9 Claims, 1 Drawing Sheet

DISTRIBUTED FEEDBACK LASER WITH LOSS COUPLING

FIELD OF THE INVENTION

This invention relates to distributed feedback lasers.

BACKGROUND OF THE INVENTION

Distributed Feedback (DFB) lasers are finding increasing importance in optical fiber communications systems since they provide a stable source of light at a narrow line width. Such lasers are characterized by the presence of a periodic variation of the laser structure usually referred to as the "grating". These gratings can be distributed in the active region of the laser or can be formed outside the boundaries of the active region. The gratings usually take the form of a periodic variation in the index of refraction of the structure, resulting in a "refractive index coupled" laser or a "loss coupled laser", depending upon the bandgap of the layer including the grating. It is generally believed that the loss coupled lasers are more advantageous due to reduced spatial hole burning, reduced sensitivity to external reflections, and other factors.

In a typical loss coupled laser, the grating is formed by materials of different bandgaps. (See, e.g., U.S. Pat. No. 5,506,859 issued to Ackerman, et al.) While acceptable, such designs require a fair degree of control in manufacture due to the changing of the composition of the materials.

SUMMARY OF THE INVENTION

The invention is a semiconductor laser which includes an active layer capable of emitting laser light, and a grating structure. The grating comprises a series of regions of high impurity concentration semiconductor material surrounded by a semiconductor material having a lesser impurity concentration which, in one embodiment, is an impurity of an opposite conductivity type.

BRIEF DESCRIPTION OF THE DRAWINGS

These and other features of the invention are delineated in detail in the following description. In the drawing.

It will be appreciated that, for purposes of illustration, these figures are not necessarily drawn to scale.

DETAILED DESCRIPTION

Figure 1:
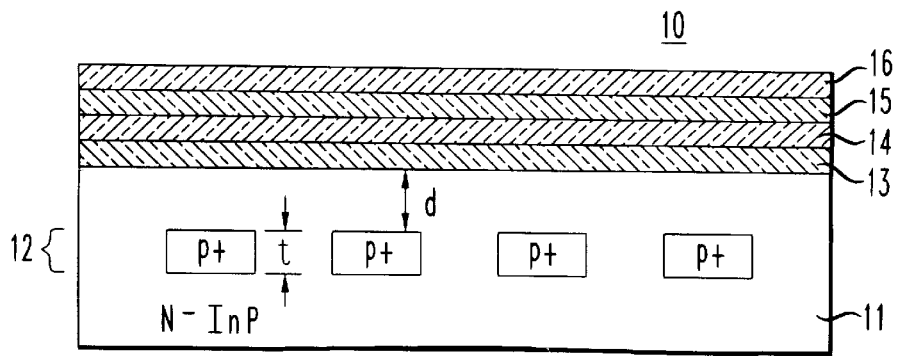
FIG. 1 is a cross-sectional view of a laser in accordance with an embodiment of the invention.

Referring now to the drawings, in which like reference numerals identify similar or identical elements, FIG. 1 illustrates a typical semiconductor laser, 10, which includes features of the invention. A substrate, 11, comprises a semiconductor material which is typically approximately 100 microns thick. The bulk of the substrate in this example comprises InP with an N-conductivity type and an impurity concentration which is within the range $1$–$5\times10^{18}$ cm$^{-3}$.

Formed within the substrate, 11, in this example is a grating, 12, which comprises a plurality of spaced regions of semiconductor material separated by the substrate material when the spaced regions have a higher impurity concentration than the substrate. In accordance with this embodiment, the spaced regions comprise InP having a P-type conductivity, but the conductivity type could be the same as that of the substrate. The impurity concentration of the p-regions is generally within the range $5\times10^{18}$ to $5\times10^{19}$ cm$^{-3}$, but in any event, at least $5\times10^{18}$ cm$^{-3}$ greater than the substrate to ensure selectivity of the wavelength of the laser emission. The grating is separated from the multi-quantum layers of the laser, to be described, by a distance, d, which is typically within the range 0.05 to 0.5 microns. The distance, d, is actually formed by a spacer layer, to be described, which is considered part of the substrate in the final device since it is the same material as the substrate. As known in the art, it is generally desirable to produce a K×L within the range 0.5–2.5, where K is the coupling and L is the length of the laser cavity. The parameters t and d, as well as the spacing, s, between the p-regions can, therefore, be determined based on this requirement.

Formed over the substrate, 11, is a layer, 13, generally referred to as the lower confinement layer of the laser. In this example, the layer, 13, comprises a quaternary material such as InGaAsP having a desired bandgap and refractive index according to principles well known in the art. (See, e.g., U.S. Pat. No. 5,506,859 cited previously.) Formed over the confinement layer, 13, is a layer, 14, which comprises the multiquantum well active region of the laser. This layer typically comprises InGaAsP. A layer, 15, also known as the upper confinement layer, is formed over the active region. This layer is typically the same composition as the layer, 13. A cladding layer, 16, which usually comprises InP, is formed over the upper confinement layer. Electrical contacts (not shown) can be formed to the substrate and cladding layer to complete the structure.

It will be noted that, rather than rely on different bandgap materials to form the grating, 12, a feature of the invention is to preferably use the same material as the substrate, but with a higher impurity concentration to vary the absorption characteristics and thereby produce the appropriate reflections to select the wavelength of emission. It will be appreciated that the grating, 12, could be formed in any of the other layers, in which case the grating material would be the same as the layer in which it is formed, but would include regions of higher impurity concentration.

Figure 2:
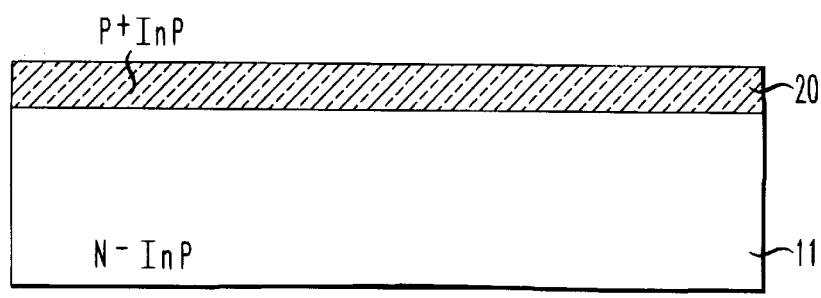
FIGS. 2–4 are cross-sectional views of the laser of FIG. 1 during various stages of fabrication.
Figure 3:
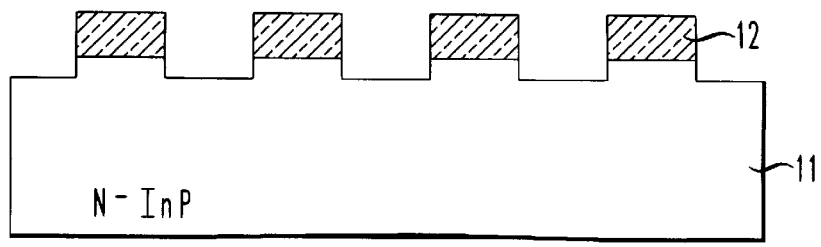
Figure 4:
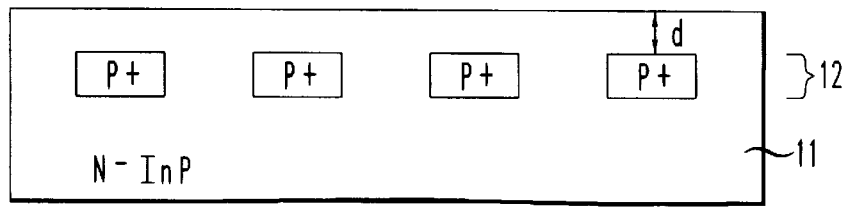

FIGS. 2–4 give an example of how the structure of FIG. 1 may be fabricated. As illustrated in FIG. 2, a layer, 20, of InP having a P+ conductivity type is deposited on a major surface of the N-type InP substrate, 11. A typical method of deposition is Modified Chemical Vapor Deposition (MOCVD). The layer, 20, will eventually form the grating, 12, and the appropriate doping for the grating has been described previously. The thickness of the layer, 20, is typically within the range 0.05 to 0.3 microns.

Next, as illustrated in FIG. 3, the layer, 20, is selectively etched by standard photolithographic techniques. The layer, 20, is completely etched through to form the individual P+ regions which will comprise the grating, 12. A standard technique, such as reactive ion etching can be employed. Preferably, etching should continue partly through the underlying substrate, 11, to ensure isolation of the P+ regions.

The P+ regions are then "buried" by depositing thereover a spacer layer of the same material as the substrate (N-type InP), again by standard MOCVD techniques. Since the layer is the same material as the substrate, the substrate and layer are illustrated as a single body, 11. The grating, 12, is now separated from the major surface by a distance, d, previously described. All that remains to form the structure of FIG. 1 is to successively deposit layers 13–16, again by MOCVD techniques.

The invention claimed is:

1. A semiconductor laser comprising:

an active layer capable of emitting laser light; and a grating comprising a series of regions of high impurity concentration semiconductor material surrounded by a semiconductor material having a lesser impurity concentration, the high impurity concentration being sufficient to vary the absorption characteristics of the grating in such a way as to select a wavelength of emission of the laser light.

2. The layer according to claim 1 wherein the regions and the surrounding material are the same semiconductor material.

3. The laser according to claim 1 wherein the laser includes a substrate having a major surface over which is formed the active layer, and the grating is formed in the substrate.

4. The laser according to claim 3 wherein the grating is separated from the major surface of the substrate by a distance within the range 0.05 to 0.5 microns.

5. The laser according to claim 1 wherein the conductivity type of the regions is opposite to that of the surrounding material.

6. The laser according to claim 1 wherein the impurity concentration of the regions is at least $5\times10^{18}$ cm$^{-3}$ greater than the impurity concentration of the surrounding material.

7. The laser according to claim 6 wherein the impurity concentration of the regions is within the range $5\times10^{18}$ to $5\times10^{19}$ cm$^{-3}$, and the impurity concentration of the surrounding material is within the range 1 to $5\times10^{18}$ cm$^{-3}$.

8. The laser according to claim 1 wherein the regions comprise InP.

9. The laser according to claim 1 wherein the laser is a multiquantum well laser.

* * * * *